United States Patent
Nakanishi et al.

(12)

(10) Patent No.: US 6,441,402 B2
(45) Date of Patent: Aug. 27, 2002

(54) OPTICAL ELECTRONIC APPARATUS AND METHOD FOR PRODUCING THE SAME

(75) Inventors: Hideyuki Nakanishi, Shiga; Toru Tsuruta, Osaka; Ryuma Hirano, Kyoto, all of (JP)

(73) Assignee: Matsushita Electronics Corporation, Osaka (JP)

(*) Notice: Subject to any disclaimer, the term of this patent is extended or adjusted under 35 U.S.C. 154(b) by 0 days.

(21) Appl. No.: 09/772,861

(22) Filed: Jan. 31, 2001

(30) Foreign Application Priority Data

Feb. 1, 2000 (JP) .......................... 2000-023684

(51) Int. Cl.⁷ .................. H01L 33/00; H01L 31/0232
(52) U.S. Cl. .................. 257/81; 257/82; 257/98; 257/100; 257/432
(58) Field of Search .................. 257/81, 82, 98, 257/99, 100, 432, 433, 676

(56) References Cited

U.S. PATENT DOCUMENTS 5,748,658 A    5/1998    Nakanishi et al.
5,821,532 A  * 10/1998    Beaman et al. ............. 257/433

FOREIGN PATENT DOCUMENTS

DE    195 08 222    *   6/1996
JP    07-183414         7/1995
JP    08-288594        11/1996

* cited by examiner

*Primary Examiner*—Minh Loan Tran
(74) *Attorney, Agent, or Firm*—Nixon Peabody LLP; Donald R. Studebaker

(57) ABSTRACT

An optoelectronic apparatus includes an optoelectronic device, a mounting portion, a frame member surrounding a periphery of the mounting portion, and an optical component. The optical component is placed on an optical component placement portion. The frame member includes a pair of first side walls and a pair of second side walls. Each of the pair of second side walls has a recessed portion and a protruded portion. The optical component is disposed between the protruded portions, and is fixed with an adhesive filled in the recessed portions.

12 Claims, 6 Drawing Sheets

PRIOR ART

OPTICAL ELECTRONIC APPARATUS AND METHOD FOR PRODUCING THE SAME

BACKGROUND OF THE INVENTION

The present invention relates to an optoelectronic apparatus and a method for producing the same. In particular, the present invention relates to an optoelectronic apparatus in which an optoelectronic device mounted on a resin package is sealed with an optical component, and a method for producing the same.

Examples of optoelectronic devices include a semiconductor laser device, which is a light emitting semiconductor device, and a light receiving semiconductor device. U.S. Pat. No. 5,748,658 discloses a semiconductor laser apparatus, an optical pick-up apparatus, an optical disk apparatus and the like, as an optoelectronic apparatus on which a semiconductor laser device and a light-receiving semiconductor device are mounted. FIGS. 7A and 7B show the structure thereof. FIGS. 7A and 7B are a schematic plan view and a schematic cross-sectional view of the structure, respectively. In FIG. 7A, an optical component 92 shown in FIG. 7B is omitted.

In the apparatus shown in FIGS. 7A and 7B, a semiconductor laser chip 70 mounted on a resin package 90 is sealed with an optical component 92. The resin package 90 is constituted by a frame member 91 made of an insulating material, a lead frame 73 including a chip mounting portion 74, and a protective plate 79. The semiconductor laser chip 70 is mounted on the chip mounting portion 74 via a silicon substrate 71 for heat sink. The optical component 92 sealing the resin package 90 on which the semiconductor laser chip 70 is mounted may be an optical flat plate or a holographic optical component. In FIGS. 7A and 7B, a heat sink 77 and a signal processing circuit 75 are also shown.

Japanese Laid-Open Patent Publication (Tokkai) Nos. 8-288594 and 7-183414 describe a semiconductor laser apparatus in which a semiconductor laser device is sealed by mounting and fixing a holographic optical component on a resin package including a frame member having steps with an ultraviolet curable adhesive.

The above-described conventional optoelectronic apparatus and the method for producing such an optoelectronic apparatus have the following problems.

With demands for large capacity and compactness of optical disk apparatuses, there is an increasing demand for a complex combination and compactness of optical components used in a semiconductor laser apparatus that is the core of an optical pick-up apparatus included in the optical disk apparatuses. The optical components are, for example, a diffraction grating, a prism, and a holographic element, and fixed onto a package on which a semiconductor laser apparatus is placed with an adhesive. Moreover, the package has a guide wall (denoted by 89 in FIGS. 7A and 7B) provided for rotation adjustment by contacting with the inner wall of a cylinder for the purpose of optical alignment of the semiconductor laser apparatus and the optical disk or the like. In recent years, with development in compactness of optoelectronic apparatuses, the distance of a space between the outer periphery of the optical component (denoted by 92 in FIGS. 7A and 7B) and the inner wall of the guide 89 has been reduced. This space serves as an adhesion portion to which an adhesive is supplied. Since this space is small, it is difficult to supply an adhesive to the adhesion portion (the space) after the optical component is mounted on the package.

In particular, in a method using a nozzle of a producing apparatus for mass production to supply an adhesive, it is difficult to insert the nozzle in the adhesion portion of a narrow space so that the nozzle cannot sufficiently be guided for appropriate fitting in the adhesion portion. Therefore, the adhesive cannot be applied to an intended portion of the optical component. As a result, the optical component cannot hermetically be fixed onto the package.

Moreover, unnecessary adhesive is applied to portions other than the adhesive portion such as the upper portion of the optical component and the periphery of the package, which leads to poor optical characteristics and poor mechanical dimension accuracy of the package. For example, when the adhesive is applied to the outer circumference of the guide wall of the package, problems may arise in alignment in some cases depending on other producing apparatuses, because alignment is performed based on the dimension of the outer circumference. In addition, a handler may not be used for holding the package.

Furthermore, since the adhesive is supplied to the overall adhesion portion of a narrow width in a wide range, the adhesive is stuck between the outer periphery of the optical component and the inner wall of the guide before the adhesive reaches the adhesion portion, so that air bubble can be contained. Thus, sufficient adhesion cannot be achieved.

SUMMARY OF THE INVENTION

In view of the above-mentioned conventional problems, it is an object of the present invention to provide an optoelectronic apparatus that can supply an adhesive easily and a method for producing the same.

An optoelectronic apparatus of the present invention includes an optoelectronic device, a mounting portion for the optoelectronic device to be mounted on, a frame member surrounding the periphery of the mounting portion, and an optical component. The optical component is placed on an optical component placement portion positioned in an inner peripheral portion on the side of the mounting portion of an upper surface of the frame member. The frame member includes a pair of first side walls opposed to each other in a portion of an outer peripheral portion positioned on an outer periphery side than the inner peripheral portion of the upper surface of the frame member, and a pair of second side walls opposed to each other in the portion of the outer peripheral portion other than the portion on which the pair of first side walls are provided. Each of the pair of second side walls has a recessed portion formed on an inner wall side of the second side wall, and a protruded portion formed in the portion on the inner wall side other than the portion on which the recessed portion is formed. The optical component is disposed between the protruded portions of the pair of second side walls, and is fixed with an adhesive filled in the recessed portions of the second side walls.

It is preferable that the mounting portion is a die pad of a lead frame, and that the first side walls, the second side walls, the optical component placement portion and the frame member are integrally formed with resin.

It is preferable that the protruded portions of the second side walls are inclined to an outer wall side, and an outer wall of a side face of the optical component is inclined to an inner side.

It is preferable that the height of the second side walls is higher than that of first side walls, and outer walls of the second side walls are arc-shaped, and inclined to the inner wall side.

It is preferable that a side wall recessed portion is provided in the first side wall in a vicinity of a portion where the second side wall and the first side wall meets.

It is preferable that the recessed portion of the second side wall and the side wall recessed portion of the first side wall are provided substantially along one direction.

It is preferable that the first side wall is longer than a length of a longer side of the optical component, and extends up to the recessed portion of the second side wall.

It is preferable that the optical component is higher than the second side wall, and a width of the optical component is smaller than that of the second side wall.

It is preferable that the adhesive is an ultraviolet curable adhesive.

A method for producing an optoelectronic apparatus of the present invention includes (a) preparing a member including a mounting portion for an optoelectronic device to be mounted on; (b) forming a frame member surrounding a periphery of the mounting portion and comprising an optical component placement portion positioned in an inner peripheral portion on a side of the mounting portion of the upper surface of the frame member, a pair of first side walls opposed to each other in a portion of an outer peripheral portion positioned on an outer side than the inner peripheral portion, and a pair of second side walls opposed to each other in the portion of the outer peripheral portion other than the portion on which the pair of first side walls are provided, a recessed portion formed on an inner wall side of the second side wall, and a protruded portion formed in the portion on the inner wall side other than the portion on which the recessed portion is formed, (c) mounting an optoelectronic device on the mounting portion; (d) placing the optical component on the optical component placement portion of the frame member; and (e) supplying an adhesive to the recessed portion with a nozzle for supplying an adhesive, thereby fixing the optical component to the optical component placement portion.

In one embodiment, in the process (a), a lead frame including a plurality of die pads are prepared as the member including a mounting portion for an optoelectronic device to be mounted on, and the process (b) includes setting the lead frame in a mold provided with an ejector pin; molding the frame member in the mold with resin; and removing the frame member from the mold by pressing the protruded portion of the frame member with the ejector pin.

In one embodiment, in the process (e), the nozzle is scanned above the recessed portion and along the recessed portion.

It is preferable that the process (d) includes semi-fixing the optical component with an ultraviolet curable adhesive and then performing optical alignment of the optical component and the optoelectronic device.

It is preferable that the process (e) includes supplying an ultraviolet curable adhesive as the adhesive to the recessed portion, and then curing the ultraviolet curable adhesive for secure fixation.

Another optoelectronic apparatus of the present invention includes an optoelectronic device, a mounting portion for the optoelectronic device to be mounted on, a frame member surrounding a periphery of the mounting portion, and an optical component. The optical component is placed on an optical component placement portion positioned in an inner peripheral portion on the side of the mounting portion of an upper surface of the frame member. The frame member comprises a side wall provided in an outer peripheral portion positioned on an outer periphery side than the inner peripheral portion of the upper surface of the frame member. An inclined portion is provided in a lower portion of the side wall of the optical component.

It is preferable that the inclined portion of the optical component is provided in a position lower than the upper surface of the side wall.

In one embodiment, an adhesive is filled between the side wall and the inclined portion, thereby fixing the optical component.

Another method for producing an optoelectronic apparatus of the present invention includes (a) preparing a member including a mounting portion for an optoelectronic device to be mounted on; (b) forming a frame member surrounding a periphery of the mounting portion and comprising an optical component placement portion positioned in an inner peripheral portion on a side of the mounting portion of the upper surface of the frame member, a side wall provided in an outer peripheral portion positioned on an outer side than the inner peripheral portion, (c) mounting an optoelectronic device on the mounting portion; (d) placing the optical component provided with an inclined portion at least in a lower portion of the side wall of the optical component on the optical component placement portion; and (e) supplying an adhesive to a space between the inclined portion of the optical component and the side wall of the frame member with a nozzle for supplying an adhesive, thereby fixing the optical component. The process (e) is performed by supplying the adhesive to a part of the inclined portion of the optical component, and allowing the adhesive to flow into a periphery of an lower region of the optical component.

In one embodiment, the process (e) comprises conveying the nozzle along one direction of the side wall of the frame member to supply the adhesive.

In the optoelectronic apparatus of the present invention, the recessed portions are formed on the inner wall side of a pair of second side walls. Thus, the recessed portions make the space between the optical component and the second side walls wide. As a result, the nozzle for supplying an adhesive can be inserted therein easily. Furthermore, the incident that the adhesive is applied to undesired portions of the optical component or the like can be reduced, and air bubble inside can be removed easily. Moreover, the optical component is disposed between the protruded portions of the pair of second side walls, and therefore alignment of the optical component can be performed in a simple and accurate manner. In addition, when the second side walls are used as the guide walls, optical alignment of the optoelectronic apparatus and the optical disk apparatus can be performed easily. Furthermore, in another optoelectronic apparatus of the present invention, an inclined portion is provided in at least a lower portion of the side wall of the optical component, so that the space between the optoelectronic component and the side wall can be made wide by the inclined portion. Therefore, the nozzle for supplying an adhesive can be inserted therein easily.

This and other advantages of the present invention will become apparent to those skilled in the art upon reading and understanding the following detailed description with reference to the accompanying figures.

DETAILED DESCRIPTION OF THE INVENTION

Hereinafter, the present invention will be described by way of embodiments with reference to the accompanying drawings. However, the present invention is not limited to the following embodiments.

Embodiment 1

Figure 1A:
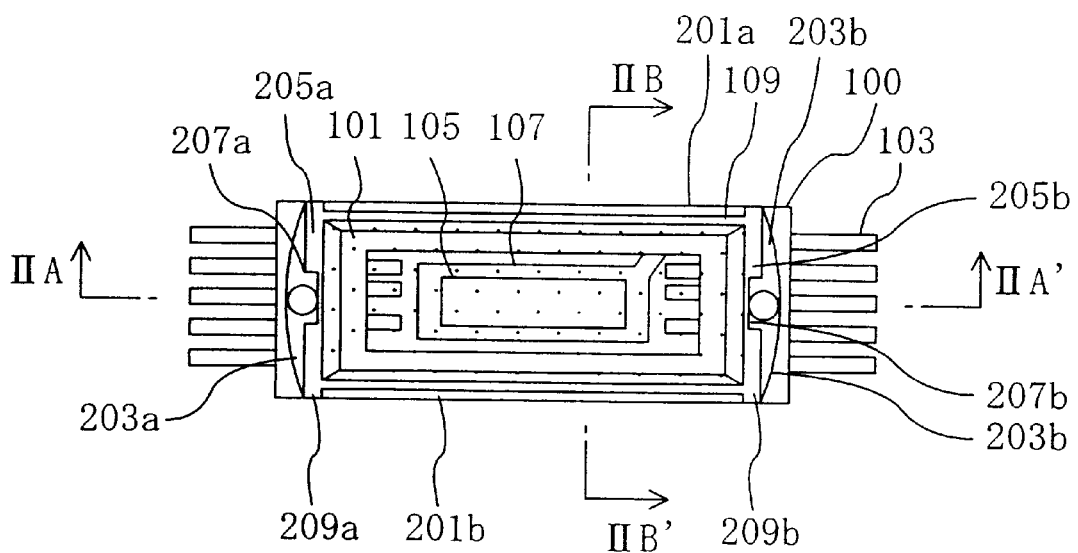
FIG. 1A is a plan view of an optoelectronic apparatus of Embodiment 1 of the present invention.
Figure 1B:
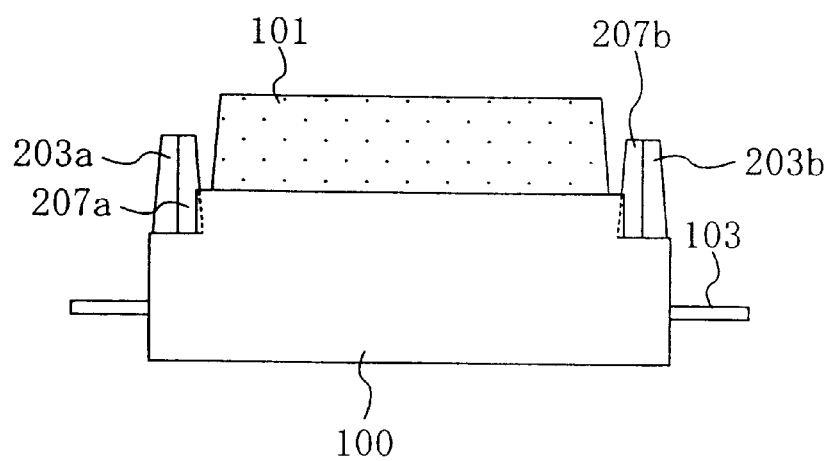
FIG. 1B is a side view of the optoelectronic apparatus shown in FIG. 1A.
Figure 2A:
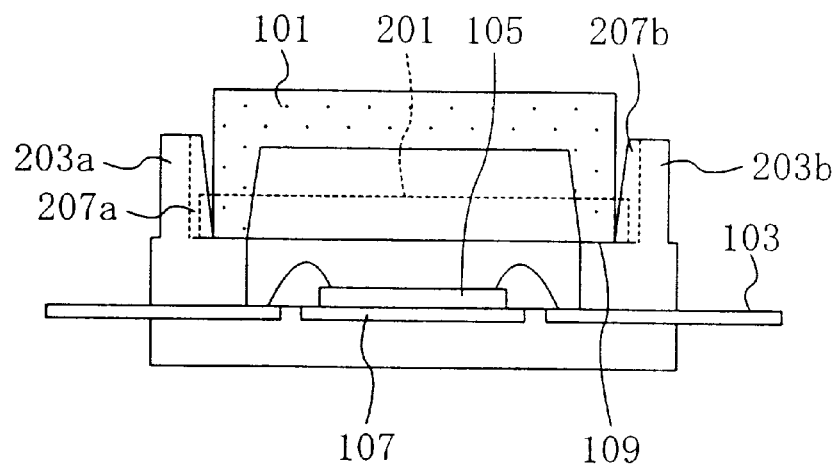
FIG. 2A is a cross-sectional view taken along line IIA–IIA' in FIG. 1A.
Figure 2B:
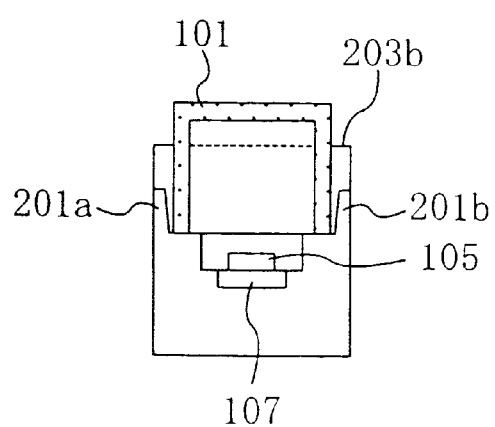
FIG. 2B is a cross-sectional view taken along line IIB–IIB' in FIG. 1A.

An optoelectronic apparatus of Embodiment 1 of the present invention will be described with reference to FIGS. 1A, 1B, 2A and 2B. FIGS. 1A and 1B are a plan view and a side view for illustrating the outline form of the optoelectronic apparatus of this embodiment. FIGS. 2A and 2B are schematic cross-sectional views taken along line IIA–IIA' and line IIB–IIB' in FIG. 1A.

The optoelectronic apparatus of this embodiment includes an optoelectronic device 105, a mounting portion 107 for the optoelectronic device 105 to be mounted on, a resin package 100 constituted by a frame member surrounding the periphery of the mounting portion 107 and an optical component 101. The optical component 101 is placed on an optical component placement portion 109 positioned in the inner periphery on the side of the mounting portion 107 of the upper surface of the package 100.

A pair of first side walls 201a and 201b and a pair of second side walls 203a and 203b are provided on the upper surface of the resin package 100. The first side walls 201a and 201b are opposed to each other in a portion of the outer peripheral portion of the upper surface of the resin package 100. The second side walls 203a and 203b are opposed to each other in the portion of the outer peripheral portion other than the portion on which the first side walls 201a and 201b are provided. The resin package 100 of this embodiment has a box-like shape in its appearance, and the first side walls 201a and 201b are provided on the longer side of the resin package 100 in a view from the above of the optoelectronic apparatus. The second side walls 203a and 203b are provided on the shorter side. A square opening is formed inside the optical component placement portion 109 of the resin package 100 in a view from the above of the optoelectronic apparatus, and an optoelectronic device 105 is provided substantially in the center of the opening.

The second side walls 203a and 203b have recessed portions 205a and 205b and protruded portions 207a and 207b on the side of the inner walls. The recessed portions 205a and 205b are formed by cutting away a part of the inner walls of the second side walls 203a and 203b in order to widen the space between the inner walls of the second side walls 203a and 203b and the optical component 101. The protruded portions 207a and 207b are portions of the second walls 203a and 203b in which the recessed portions 205a and 205b are not formed. The upper surface of the resin package 100 provided with the protruded portions 207a and 207b are portions onto which ejector pins (E pins) used for release of the resin package 100 from a mold in production of the resin package 100 is pressed. In FIG. 1A, a pin mark by the ejector pin is shown as a circle.

The resin package 100 including the first side walls 201a and 201b and the second side walls 203a and 203b are integrally formed of resin together with the lead frame 103. A die pad 107 formed as a part of the lead frame 103 serves as the mounting portion 107 for the optoelectronic device 105. In this embodiment, the optoelectronic device 105 is mounted on the die pad 107. More specifically, a semiconductor laser device is provided on the die pad 107 via a light receiving device constituted by a silicon substrate. The lead frame 103 is made of copper, and the thickness thereof is about 0.2 to 0.3 mm. The portion of the die pad 107 of the lead frame 103 is exposed in the resin package 100 so that the optoelectronic device 105 can be mounted thereon.

The optical component 101 that seals the optoelectronic device 105 in cooperation with the resin package 100 is provided above the optoelectronic device 105. The optical component 101 is a holographic element, a diffraction device, a prism and a microlens, for example. In this embodiment, a holographic element 101 is used as the optical component. The holographic element 101 is mounted on the optical component placement portion 109 with alignment and is positioned between the protruded portions 207a and 207b. The holographic element 101 is fixed to the optical component placement portion 109 with an adhesive (not shown) filled between the recessed portions 205a and 205b of the second side walls 203a and 203b. In FIG. 1A, the transparent holographic element 101 is shown as a dotted pattern.

The holographic element 101 in this embodiment is formed of, for example, transparent resin or glass, and has a rectangular solid (the longer side: about 10 mm, the shorter side: about 4 mm, and the height: about 5 mm). A hollow portion having an opening is provided in the back of the holographic element 101. On the other hand, a hologram pattern by a diffraction grating is formed on the surface of the holographic element 101, and diffraction, split, and conversion of light beams are performed with the hologram pattern. When the optoelectronic apparatus of this embodiment is operated, for example, as a optical pick-up apparatus, the structure of the optical pick-up apparatus can be realized based on a known technique as disclosed in, for example, U.S. Pat. No. 5,748,658, which is herein incorporated by reference. For example, an optical pick-up device can be constituted by the optoelectronic apparatus of this embodiment (semiconductor laser apparatus), a reflective mirror, and an objective lens.

Next, the structure of the resin package 100 will be described in detail. The optical component placement portion 109 provided in the periphery of the mounting portion 107 for the optoelectronic device 105 is provided flat in a predetermined height at least about 1.5 times higher than the height (about 200 to 500 microns) of the optoelectronic device 105. The first side walls 201a and 201b are opposed to each other with the optical component placement portion 109 interposed therebetween in a part of the outer periphery of the optical component placement portion 109. The first side wall 201a and 201b are opposed also to the longer sides of the holographic element 101.

Furthermore, the second side walls 203a and 203b are opposed to each other with the optical component placement portion 109 interposed therebetween and are opposed to the shorter sides of the holographic element 101. The height of the second side walls 203a and 203b is higher than that of the first side walls 201a and 201b and lower than that of the holographic element 101. When the height of the second side walls 203a and 203b is lower than that of the first side walls 201a and 201b, it is difficult to perform alignment using the second side walls in assembly. When the height of the second side walls 203a and 203b is higher than that of the holographic element 101, the height of the second side walls 203a and 203b interferes with the placement of the holographic element 101.

The outer walls of the second side walls 203a and 203b are arc-shaped. The opposing second side walls 203a and 203b are positioned on a predetermined circumference. Thus, the portions of the second side walls 203a and 203b of the resin package 100 can be inserted into a cylindrical hollow. In other words, the second side walls 203a and 203b act as guide walls in the following manner. In alignment and attachment of the optoelectronic apparatus (or a semiconductor laser apparatus) to an objective lens of an optical disk apparatus, the second side walls 203a and 203b are inserted in the cylindrical hollow aligned with the objective lens, and then slid thereto. In this manner, rotation adjustment of the optoelectronic apparatus can be performed easily. In this embodiment, in order to facilitate the insertion to the cylindrical hollow, the upper surfaces of the second side walls 203a and 203b are higher than those of the first side walls 201a and 201b, and the outer walls of the second side walls 203a and 203b are arc-shaped and are inclined (for example, about 4°) to the inner side.

The inner walls of the second side walls 203a and 203b are provided with the protruded portions 207a and 207b that are formed by forming the recessed portions 205a and 205b from both sides of the inner walls of the second side walls. In this embodiment, the recessed portions 205a and 205b are not formed in the entire portion of the inner walls of the second side walls, but the protruded portions 207a and 207b are left in the inner walls of the second side walls 203a and 203b. This embodiment makes it possible to remove easily the resin package 100 from a mold by pressing the protruded portions 207a and 207b with ejector pins. Thus, this is a great advantage in the production process. When the recessed portions 205a and 205b are formed entirely in the inner walls of the second side walls 203a and 203b, a flat portion for ejector pins to press cannot be obtained. In addition, the thickness of the second side walls 203a and 203b is small, so that the necessary strength against pressing with the ejector pins cannot be obtained. Therefore, in view of these problems, in general, it may not be preferable to provide the recessed portions 205a and 205b. However, in this embodiment, the recessed portions 205a and 205b are formed from both sides, which avoids these problems.

Moreover, this embodiment where the recessed portions 205a and 205b are formed from both sides has the following advantage. Not only can a nozzle for supplying an adhesive to the recessed portions 205a and 205b be introduced directly from the above to insert in the recessed portions, but also can move easily from the side of the inner walls of the second side walls 203a and 203b in the traverse direction. Therefore, the incidence of impingement of the nozzle on the resin package 100 can be reduced.

The recessed portions 205a and 205b can be deep enough that an adhesive can be supplied with a nozzle, and a preferable depth can be selected as appropriate. In this embodiment, the edge portion where the upper surface of the second side wall 203a overlaps the inner wall of the recessed portion 205a is positioned about 0.3 to 0.4 mm outer than the edge portion where the upper surface of the second side wall 203a overlaps the inner wall of the protruded portion 207a, in a view from the above of the optoelectronic apparatus. The second wall 203b opposed to the second wall 203a has the same design as that of the second wall 203a.

In the example shown in FIG. 1B, the inner walls of the recessed portions 205a and 205b are substantially vertical. However, the inner walls of the recessed portions 205a and 205b can be inclined. The angle of the inner walls of the recessed portions 205a and 205b can be selected as appropriate and not limited to any particular angle. For example, the inner walls of the recessed portions 205a and 205b can be inclined to the outer wall side by about 0° to 30° (for example, about 15°) with respect to the vertical line (for example, the normal line with respect to the lead frames 103). When the inner walls of the recessed portions 205a and 205b are inclined, mold-release can be performed better when producing the resin package 100.

It is preferable that the protruded portions 207a and 207b of the second side walls 203a and 203b are positioned so that a symmetry can be formed, in view of the case where the protruded portions 207a and 207b are provided with an alignment function of the holographic element 101. In particular, it is preferable to position the protruded portions 207a and 207b in the centers of the second side walls 203a and 203b for mechanical strength. The gap between the protruded portions 207a and 207b can be selected in accordance with the size of the holographic element 101. The gap can be of any size, as long as it permits alignment for placing the holographic element 101 for assembly, and ensures a tolerance (margin). A tolerance can be obtained, for example, by slightly inclining the inner walls of the protruded portions 207a and 207b to the outer wall side. When the inner walls of the protruded portions 207a and 207b are inclined to the outer wall side by, for example, about 5°, mold-release can be performed satisfactorily in the resin sealing process. It is preferable that the outer side walls of the holographic element 101 are inclined to the inner side, as shown in FIG. 1B, for easiness of the placement of the holographic element 101 between the first side walls and between the second side walls.

Next, a method for producing the optoelectronic apparatus of this embodiment will be described. The optoelectronic apparatus of this embodiment can be produced in the following manner, for example.

First, a lead frame 103 including a die pad 107 is prepared, and then the lead frame 103 is set in a mold. Then, a resin sealing process commonly used to produce a regular semiconductor apparatus is performed so that the first side walls and the second side walls (201a, 201b, 203a, 203b) and the optical component placement portion 109 are integrally formed. Thus, a resin package 100 can be obtained.

Then, a holographic element 101 is placed in the optical component placement portion 109 to which an ultraviolet curable adhesive, which is a photocurable adhesive, is applied, and optical alignment is performed. Thereafter, the adhesive is irradiated with light for preliminary fixation. Then, again, an adhesive is supplied along the recessed portions 205a and 205b by moving a nozzle for supplying an adhesive for secure fixation. It is preferable to use an ultraviolet curable adhesive as the adhesive used for secure fixation, because the nozzle can be narrow by selecting a suitable adhesive with regard to the relationship between the temperature of the adhesive when supplied and the flowability thereof. In particular, a narrow tip of the nozzle is significantly advantageous, because the tip can be inserted in the space to ensure reliable supply of the adhesive.

Figure 3A:
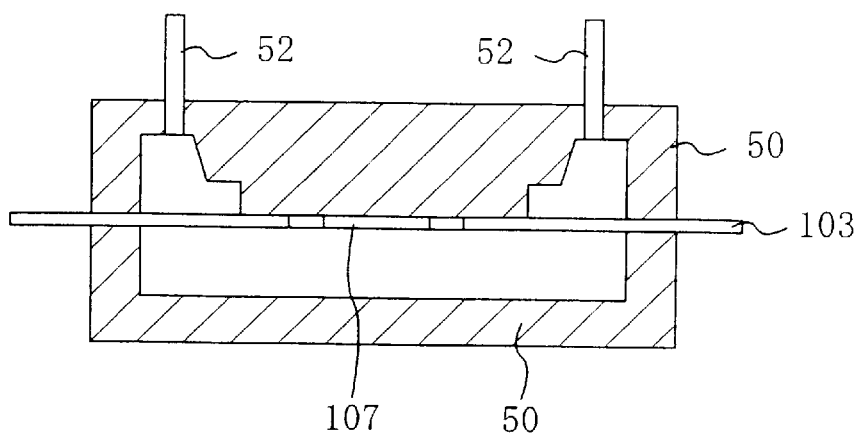
FIGS. 3A to 3C are cross-sectional views of a production sequence for illustrating a method for producing the optoelectronic apparatus of Embodiment 1.
Figure 3B:
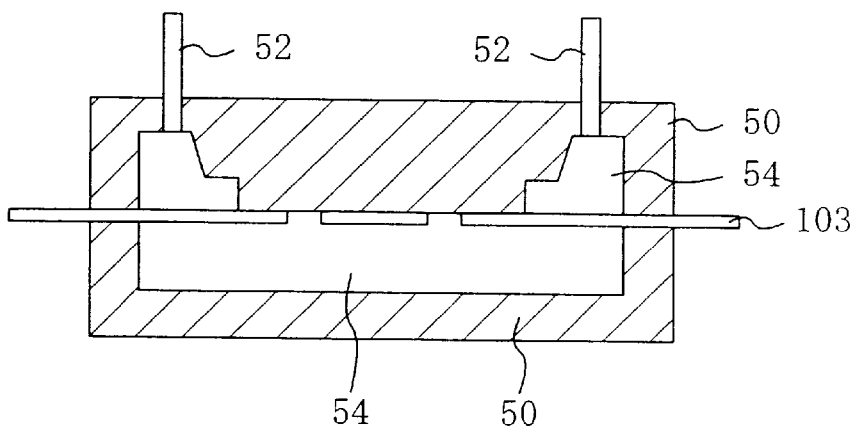
Figure 3C:
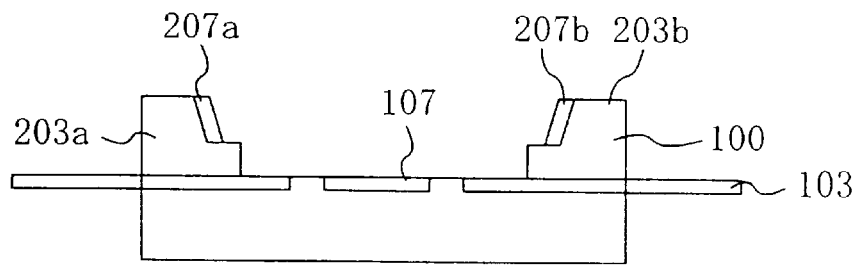

Hereinafter, the method for producing the optoelectronic apparatus of this embodiment will be described further in detail with reference to FIGS. 3A to 3C and FIGS. 4A to 4D. FIGS. 3A to 3C are cross-sectional views for illustrating a process sequence for forming a resin package. FIGS. 4A to 4D are cross-sectional views for illustrating a process sequence for attaching the optical component.

First, a lead frame 103 including a mounting portion (die pad) 107 for an optoelectronic device to be mounted on is prepared. The lead frame 103 including a plurality of die pads 107 is advantageous, because a multiple of optoelectronic apparatuses can be produced at one time. As shown in FIG. 3A, the lead frame 103 is set in a mold 50. The mold 50 is provided with ejector pins (E pins) 52 to be pressed for releasing the resin package from the mold.

Then, as shown in FIG. 3B, a resin 54 is poured in the mold 50 for resin sealing. This resin sealing forms the resin package 100 including the first side walls 201a and 201b, the second side walls 203a and 203b provided with the recessed portions and the protruded portions, and the optical component placement portion 109.

Then, as shown in FIG. 3C, the resin package 100 is removed from the mold 50 by pressing the protruded portions 207a and 207b in the resin package 100 with the E pins 52. Although not shown in FIGS. 3A or 3B, not only the upper part of the mold 50, but also the lower part of the mold 50 is provided with E pins 52 for mold-release, so that the mold-release can be achieved by pressing the back of the resin package 100 with these E pins 52.

Figure 4A:
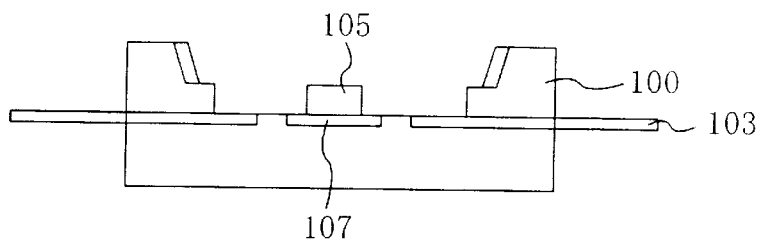
FIGS. 4A to 4D are cross-sectional views of a production sequence for illustrating a method for producing the optoelectronic apparatus of Embodiment 1
Figure 4B:
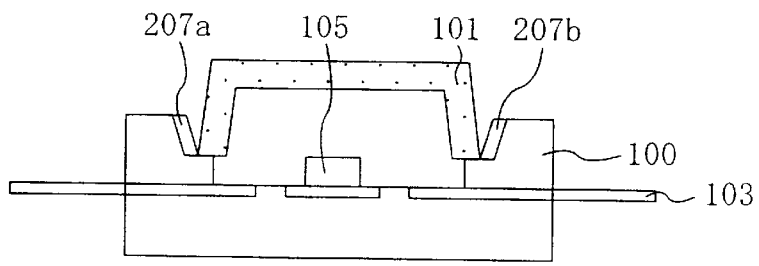

Then, as shown in FIG. 4A, an optoelectronic device 105 is mounted on the die pad 107 in the resin package 100. Then, an ultraviolet curable adhesive is applied to the optical component placement portion 109 in the resin package 100. Thereafter, as shown in FIG. 4B, the holographic element 101 is placed in the optical component placement portion 109. Then, the holographic element 101 is optically aligned based on the protruded portions 207a and 207b. Thereafter, light irradiation is performed for preliminary fixation of the holographic element 101.

Figure 4C:
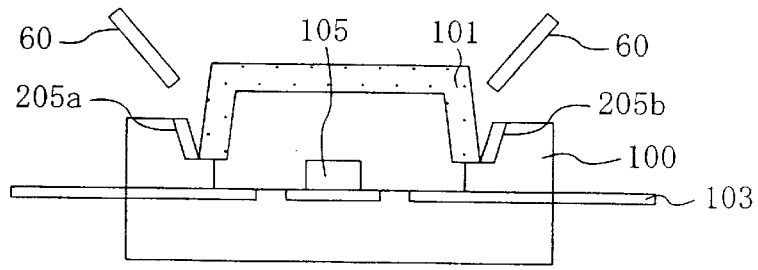
Figure 4D:
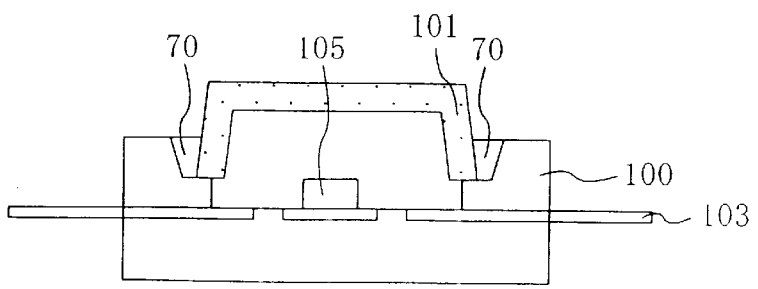

Next, as shown in FIG. 4C, a nozzle 60 for supplying an adhesive is prepared, and then the tip of the nozzle 60 is inserted in the space between the recessed portions 205a and 205b and the holographic element 101 so that an ultraviolet curable adhesive is supplied to this space from the nozzle 60 for secure fixation. As shown in FIG. 4D, the secure fixation ensures attachment of the holographic element 101 to the resin package 100. Since in general, the ultraviolet curable adhesive has a relatively high viscosity, it is preferable to adjust the temperature of the adhesive when supplied so that a desired flowability can be obtained. When supplying the adhesive, the nozzle 60 not only can be inserted from the above of the resin package 100, but also can be inserted from the side.

When the adhesive is supplied in a large amount, the adhesive overflows, and the overflown adhesive adheres to the holographic element 101, which may deteriorate the optical characteristics thereof. In order to avoid this problem, the optoelectronic apparatus of this embodiment is provided with side wall recessed portions 209a and 209b in the first side walls 201a and 201b in the vicinity of the portions where the second side walls 203a and 203b and the first side walls 201a and 201b, as shown in FIG. 1A. These side wall recessed portions 209a and 209b prevent the excessive adhesive from overflowing and adhering to the holographic element 101. Furthermore, in the design of this embodiment, the recessed portions 205a and 205b of the second side walls 203a and 203b and the side wall recessed portions 209a and 209b are provided substantially along one direction. For this reason, the overflow of the excessive adhesive supplied to the recessed portions 205a and 205b can be resolved swiftly.

Furthermore, in this embodiment, the length of the first side walls 201a and 201b is longer than that of the longer side of the holographic element 101, and the first side walls 201a and 201b are extended to the inner side of the recessed portions 205a and 205b where the first side walls 205a and 205b meet with the second side walls 203a and 203b. This embodiment makes it easy that the adhesive is attached to the shorter side of the holographic element 101.

In this embodiment, since the recessed portions 205a and 205b are provided on the inner wall side in the second side walls 203a and 203b of the resin package 100, the space between the holographic element 101 and the second side walls 203a and 203b can be wide. As a result, even if the size of the optoelectronic apparatus is small, the nozzle 60 for supplying an adhesive can be inserted easily in the production process.

Furthermore, since the space between the holographic element 101 and the second side walls 203a and 203b is wide, the incident that unnecessary adhesive is applied to portions other than the adhesion portion, such as the upper portion of the optical component and the peripheral portion of the package, can be reduced. This can prevent deterioration in the optical characteristics or the mechanical size accuracy of the package. Furthermore, the widened space between the holographic element 101 and the second side walls 203a and 203b can prevent the adhesive from being stuck in the space before reaching the adhesion portion and generating air bubbles. In other words, air bubbles inside can be emitted out easily, and as a result, the holographic element 101 and the resin package 100 can be adhered sufficiently for fixation. In addition, optical alignment of the optoelectronic apparatus and the optical disk or the like can be performed easily by using the second side walls 203a and 203b as the guide walls.

Embodiment 2

Figure 5:
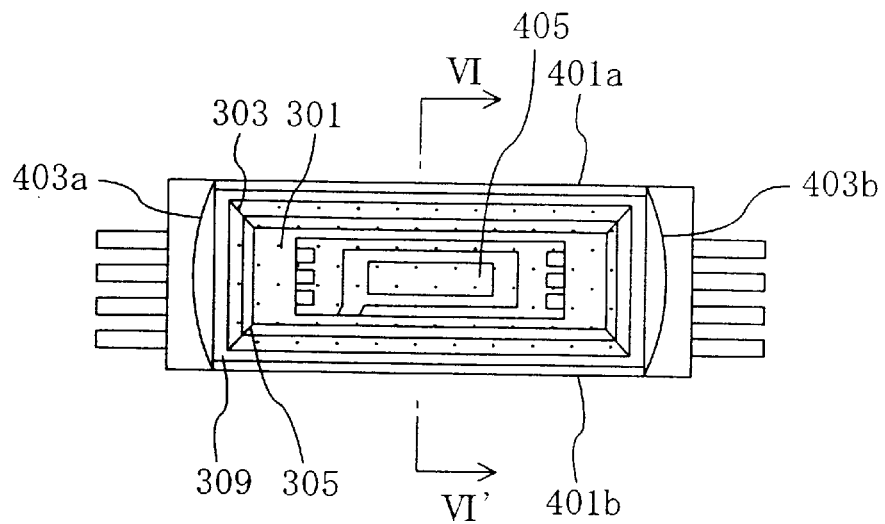
FIG. 5 is a plan view of an optoelectronic apparatus of Embodiment 2.
Figure 6:
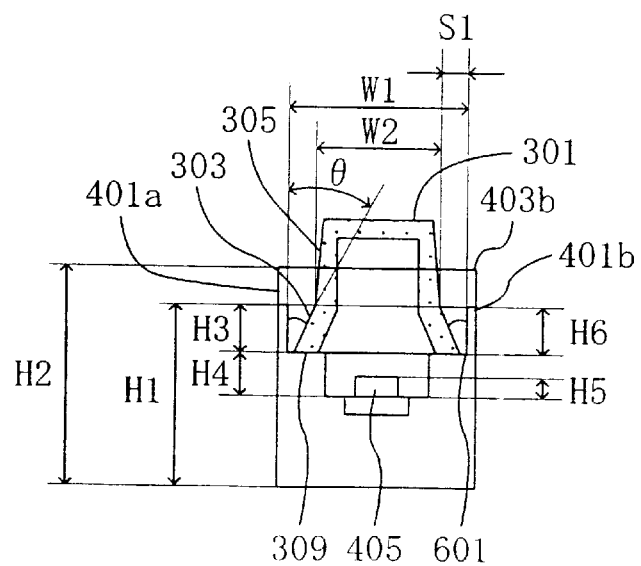
FIG. 6 is a cross-sectional view taken along line VI–VI' in FIG. 5.
Figure 7A:
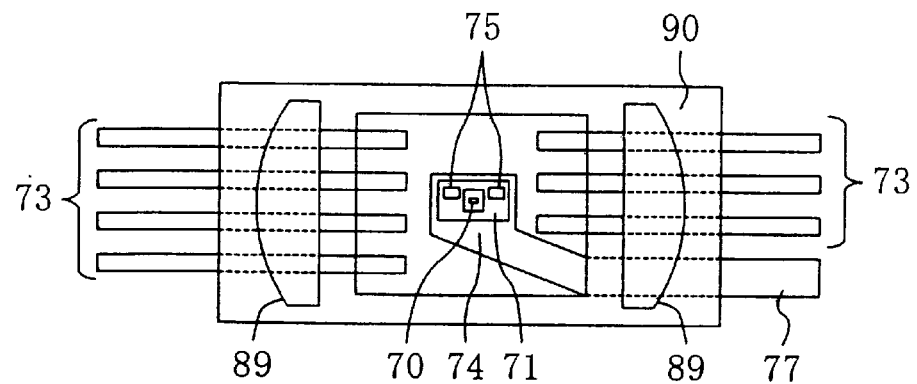
FIG. 7A is a plan view for illustrating a structure of a conventional optoelectronic apparatus.
Figure 7B:
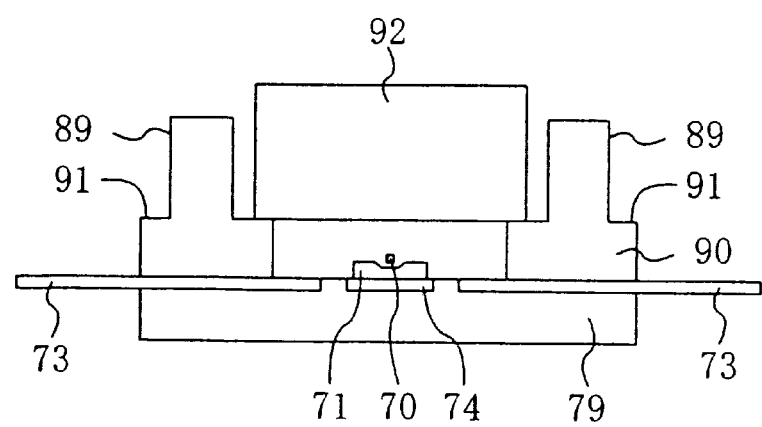
FIG. 7B is a cross-sectional view of the apparatus shown in FIG. 7A.

The optoelectronic apparatus of Embodiment 2 of the present invention will be described with reference to FIGS. 5 and 6. FIGS. 5 and 6 are a plan view and a side view showing the outline form of the optoelectronic apparatus of this embodiment. FIG. 6 shows a schematic cross-sectional view taken along line VI–VI' of FIG. 5. The optoelectronic apparatus of this embodiment is formed of similar materials to those used for the optoelectronic apparatus of Embodiment 1, and has substantially the same shape, but is different from the design of Embodiment 1 in the following points. For simplification, the same structural parts as those of Embodiment 1 will not be described further.

In the optoelectronic apparatus of this embodiment, as shown in FIG. 5, the side wall recessed portions (209a and 209b in FIG. 1A) are not formed between the second side walls 403a and 403b and the first side walls 401a and 401b. The side wall recessed portions are not formed for the purpose of achieving enclosure of the holographic element 301 by the first side walls 401a and 401b and the second side walls 403a and 403b, so that the adhesive supplied by a nozzle can flow to the surrounding of the holographic element 301. In order to allow the adhesive to flow in such a manner, it is preferable to adjust the flowability of the adhesive to be high.

In this embodiment, the holographic element 301 is provided with a base inclined portion (lower inclined portion) 303 positioned on the side of the base and an upper inclined portion 305 positioned above the base inclined portion 303. The holographic element 301 is provided with the base inclined portion 303, so that the space between the holographic element 301 and the first side walls and the second side walls (401a, 401b and 403a, 403b) can be wide. The base inclined portion 303 is provided with, for example, an angle larger than the inclined angle when a member is drawn out from a regular mold, and has about an angle that allows the adhesive to flow on the base inclined portion 303 even if the adhesive is partially supplied from the nozzle.

Furthermore, the angle of the base inclined portion 303 is larger than that of the upper inclined portion 305. This allows the lower portion of the base inclined portion to be close to a corner portion 601 where the optical component placement portion 309 and the side wall (401a, etc.) to an extent that alignment control can be performed when assembled. In addition, supply and flow space for the adhesive can be obtained. Furthermore, a part (a close portion) of the lower portion of the base inclined portion 303 is close to the corner portion 601, so that the flow of the adhesive can be achieved by supplying a small amount of the adhesive. Therefore, it is possible to supply the adhesive by allowing the adhesive to flow without moving the nozzle to a peripheral region that is hardly reached by the nozzle. As a result, the movement of the nozzle is small, so that application of the adhesive to unnecessary portion is reduced. In addition, the holographic element (optical component) 301 can adhere firmly. Furthermore, the upper side of the base inclined portion 303 of the holographic element 301 is provided with a gap that allows conveyance of the nozzle or position control thereof to be performed with tolerance, and ensures supply of the adhesive, so that supply of the adhesive by the nozzle can be performed easily and reliably.

The inclined angle θ of the base inclined portion 303 is for example, 20 to 60°, preferably 30 to 50°. When the inclined angle θ is small, a space S1 becomes narrow, and therefore supply of the adhesive from the nozzle is difficult. On the other hand, when the inclined angle θ is large, an upper side width W2 necessary for providing a space where a diffraction grating is made and the optoelectronic device 405 is accommodated becomes further narrower than the base portion width W1 of the holographic element 301, so that the width W2 becomes too narrow for the diffraction grating and the optoelectronic device 405. Furthermore, when the upper side width W2 is made wide, the entire scale of the optoelectronic apparatus becomes large, so that compactness cannot be achieved. Therefore, it is preferable to determine the shape of the holographic element 301, especially the inclined angle θ of the base inclined portion 303 in view of the above-described points.

The base inclined portion 303 is not necessarily provided in all the regions of the periphery of the base of the holographic element 301. The base inclined portion 303 may be provided only in the side along the first side wall 401a and 401b. This is because after the adhesive is supplied t from a nozzle to the side along the first side walls 401a and 401b, the adhesive can be supplied to the second side walls 403a and 403b, utilizing the flowability of the adhesive. When the corner portion 601 corresponding to a junction of the first side walls 401a and 401b and the second side walls 403a and 403b of the base inclined portion 303 is slightly rounded or notched, or is provided with a large inclined angle, the adhesive in the first side walls 401a and 401b can reach the second side walls 403a and 403b easily.

Furthermore, it is preferable that the inclined angle of the base inclined portion 303 of the holographic element 301 on the side of the first side walls 401a and 401b is larger than that on the side of the second side walls 403a and 403b. This embodiment ensures a sufficient space for supply of the adhesive from the first side walls 401a and 401b which have a small height that allows easy movement of the nozzle.

The height H2 of the second side walls 403a and 403b are larger than the height H1 of the first side walls 401a and 401b. The height H3 of the first side walls 401a and 401b on the inner wall side is larger than the height H6 of the base inclined portion 303. These are preferable because the adhesive 601 is enclosed so as not to leak out. The height H4 of the optical component placement portion 309 is larger than the thickness H5 of the optoelectronic device 405. H4 is higher than H5 for the following reasons. Wirebonding or the like for electrical connection may be performed with respect to the optoelectronic device 405. The space necessary for wirebonding is obtained not by enlarging the space inside the holographic element 301, but by utilizing the height H4 of the optical component placement portion 309.

A method for producing the optoelectronic apparatus of this embodiment is substantially similar to that described in Embodiment 1, except for the process of supply of the adhesive for secure fixation. Hereinafter, this point will be described.

In the process for secure fixation in this embodiment, one nozzle for each of two space portions between the first side walls 401a and 401b and the holographic element 301 (two nozzle in total) is prepared, and the nozzles are simultaneously conveyed along the first side walls 401a and 401b to supply the adhesive. High accuracy is required to insert the nozzle between the second side walls 401a and 401b having a high height and the holographic element 301. Therefore, in this embodiment, the adhesive is supplied by conveying the nozzle simply in one direction between the first side walls 401a and 401b having a low height and the holographic element 301, and then the supplied adhesive is moved to the space between the second side walls 403a and 403b and the holographic element 301. This method makes it possible to supply the adhesive from the above of the peripheral portion of the base of the holographic element 301 without changing the direction of the nozzle conveyance by as much as 90°, avoiding the high side walls, so that the holographic element 301 can adhere to these side walls (see FIG. 6). In this case, the flowability can be controlled by using, for example, an ultraviolet curable adhesive as the adhesive, and controlling the temperature by winding a heater or the like around the nozzle.

In this embodiment, the holographic element 301 is provided with the base inclined portions 303, so that the space between the holographic element 301 and the side walls (401a, etc.) can be wide. As a result, the nozzle for supplying the adhesive can be inserted therein easily. The base inclined portion 303 inclines by an angle larger than the inclined angle when the member is drawn out from a regular mold, so that even if the adhesive is partially supplied from the nozzle, the adhesive can flow into the peripheral regions that are hardly reached by the nozzle. Such an embodiment reduces the distance of the movement of the nozzle, and simplifies the direction of the movement of the nozzle, so that the adhesive can be supplied easily and reliably.

According to the present invention, the recessed portions are formed in the second side walls on the inner wall side, so that the space between the optical component and the second side walls can be wide. As a result, the nozzle for supplying an adhesive can be inserted therein easily, and therefore the present invention can provide an optoelectronic apparatus that can supply an adhesive easily and a method for producing the same. Furthermore, the incident that the adhesive is applied to undesired portions can be reduced, and air bubble inside can be removed easily. When an inclined portion is provided in at least a lower portion of the side wall of the optical component, this inclined portion widens the space between the optoelectronic component and the side wall. Therefore, the nozzle for supplying the adhesive can be inserted therein easily.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An optoelectronic apparatus comprising:

an optoelectronic device;

a mounting portion for the optoelectronic device to be mounted on;

a frame member surrounding a periphery of the mounting portion; and an optical component, wherein the optical component is placed on an optical component placement portion positioned in an inner peripheral portion on a side of the mounting portion of an upper surface of the frame member, the frame member comprises a pair of first side walls opposed to each other in a portion of an outer peripheral portion positioned on an outer periphery side than the inner peripheral portion of the upper surface of the frame member, and a pair of second side walls opposed to each other in the portion of the outer peripheral portion other than the portion on which the pair of first side walls are provided, each of the pair of second side walls has a recessed portion formed on an inner wall side of the second side wall, and a protruded portion formed in the portion on the inner wall side other than the portion on which the recessed portion is formed, and the optical component is disposed between the protruded portions of the pair of second side walls, and is fixed with an adhesive filled in the recessed portions of he second side walls.

2. The optoelectronic apparatus of claim 1, wherein the mounting portion is a die pad of a lead frame, and the first side walls, the second side walls, the optical component placement portion and the frame member are integrally formed with resin.

3. The optoelectronic apparatus of claim 1, wherein the protruded portions of the second side walls are inclined to an outer wall side, and an outer wall of a side face of the optical component is inclined to an inner side.

4. The optoelectronic apparatus of claim 1, wherein a height of the second side walls is higher than that of first side walls, and outer walls of the second side walls are arc-shaped, and inclined to an inner wall side.

5. The optoelectronic apparatus of claim 1, wherein a side wall recessed portion is provided in the first side wall in a vicinity of a portion where the second side wall and the first side wall meets.

6. The optoelectronic apparatus of claim 5, wherein the recessed portion of the second side wall and the side wall recessed portion of the first side wall are provided substantially along one direction.

7. The optoelectronic apparatus of claim 5, wherein the first side wall is longer than a length of a longer side of the optical component, and is extended up to the recessed portion of the second side wall.

8. The optoelectronic apparatus of claim 1, wherein the optical component is higher than the second side wall, and a width of the optical component is smaller than that of the second side wall.

9. The optoelectronic apparatus of claim 1, wherein the adhesive is an ultraviolet curable adhesive.

10. An optoelectronic apparatus comprising:

an optoelectronic device, a mounting portion for the optoelectronic device to be mounted, a frame member surrounding a periphery of the mounting portion, and an optical component, wherein the optical component is placed on an optical component placement portion positioned in an inner peripheral portion on a side of the mounting portion of an upper surface of the frame member, the frame member comprises a side wall provided in an outer peripheral portion positioned on an outer periphery side than the inner peripheral portion of the upper surface of the frame member, and an inclined portion is provided in a lower portion of a side wall of the optical component.

11. The optoelectronic apparatus of claim 10, wherein the inclined portion of the optical component is provided in a position lower than the upper surface of the side wall.

12. The optoelectronic apparatus of claim 10, wherein an adhesive is filled between the side wall and the inclined portion, thereby fixing the optical component.

* * * * *

UNITED STATES PATENT AND TRADEMARK OFFICE
CERTIFICATE OF CORRECTION

PATENT NO.    : 6,441,402 B2
DATED         : August 27, 2002
INVENTOR(S)   : Hideyuki Nakanishi et al.

It is certified that error appears in the above-identified patent and that said Letters Patent is hereby corrected as shown below:

<u>Title page,</u>
Item [73], delete "Matsushita Electronics Corporation" and
add -- Matsushita Electric Industrial Co., Ltd. --

Signed and Sealed this

Eighteenth Day of February, 2003

JAMES E. ROGAN
*Director of the United States Patent and Trademark Office*